(12) United States Patent
Herner et al.

(10) Patent No.: US 6,639,312 B2
(45) Date of Patent: Oct. 28, 2003

(54) DUMMY WAFERS AND METHODS FOR MAKING THE SAME

(75) Inventors: Scott Brad Herner, Palo Alto, CA (US); James M. Cleeves, Redwood City, CA (US)

(73) Assignees: Matrix Semiconductor, Inc, Santa Clara, CA (US); LSI Logic Corporation, Santa Clara, CA (US)

( * ) Notice: Subject to any disclaimer, the term of this patent is extended or adjusted under 35 U.S.C. 154(b) by 0 days.

(21) Appl. No.: 10/036,291

(22) Filed: Nov. 7, 2001

(65) Prior Publication Data

US 2003/0087108 A1 May 8, 2003

(51) Int. Cl.[7] ............... H01L 21/31; H01L 21/469; H01L 23/12
(52) U.S. Cl. ............... 257/701; 118/724; 438/791
(58) Field of Search ............... 257/701; 118/724; 438/791

(56) References Cited

U.S. PATENT DOCUMENTS

| 5,455,445 | A | 10/1995 | Kurtz et al. |
| 5,658,833 | A | 8/1997 | Chen et al. |
| 6,121,114 | A | 9/2000 | Chen et al. |
| 6,140,211 | A | 10/2000 | Nanda et al. |
| 6,204,206 | B1 | 3/2001 | Hurley |
| 6,255,233 | B1 | 7/2001 | Smith et al. |
| 6,406,978 | B1 * | 6/2002 | Yang et al. ........ 438/458 |

OTHER PUBLICATIONS

Brian Dipert, "Exotic Memories, Diverse Approaches", Edn Asia, Sep. 2001, 22–33.

* cited by examiner

Primary Examiner—Alexander Ghyka
(74) Attorney, Agent, or Firm—Pamela J. Squyres

(57) ABSTRACT

Dummy wafers that are used in IC manufacturing and methods for manufacturing the same are described. The dummy wafers are made with an increased resistance to breaking during CVD manufacturing process. The dummy wafers are made by placing a protective film over the wafer surface(s) exposed during the CVD process. By increasing the resistance to breaking, the protective film extends the useful life of the dummy wafers.

11 Claims, 2 Drawing Sheets

DUMMY WAFERS AND METHODS FOR MAKING THE SAME

FIELD OF THE INVENTION

The invention generally relates to methods for fabricating integrated circuits (ICs) and semiconductor devices and the resulting structures. More particularly, the invention relates to dummy wafers used in IC manufacturing and methods for making such structures. Even more particularly, the invention relates to dummy wafers with increased lifetimes and methods for making such dummy wafers.

BACKGROUND OF THE INVENTION

Chemical vapor deposition (CVD) is one common method used to form the various films and layers that are used to make the components in an integrated circuit (IC). There are various types of CVD, such as low pressure (LP) CVD, high pressure (HP) CVD, plasma enhanced (PE) CVD, as well as others. CVD can be used to deposit many different types of materials, such as silicon, dielectric materials, and metals such as tungsten or titanium.

Silicon (Si) is one material that is often used in ICs. One method to deposit silicon in thin film form is by using LPCVD. In this method, wafers are heated in a pressure vessel to between 450° C. and 650° C. while atmospheric gases are pumped out. When the pressure in the vessel, such as a quartz tube, reaches 200–1000 mTorr and the wafers have reached such a desired temperature, a silicon containing gas such as silane ($SiH_4$) is flowed into the vessel. Thermal breakdown of SiH4 results in the deposition of Si on the surface. Excellent control of the thickness of the film, the thickness uniformity across a wafer, and step coverage (the ability to cover varied topography on the wafer) is achieved by adjusting the operating parameters (like temperature, pressure, and gas flow) in the vessel.

Many IC manufacturing processes not only require the deposition of thin films of silicon, but also require that the thin film be doped to make it conductive. Doping processes introduce foreign atoms (ions)—like boron (B) or phosphorous (P)—into the silicon material to modify the conductivity of the Si atoms. One common method to dope silicon is by ion implantation, a process where foreign atoms are ionized, accelerated by electromagnetic fields, and then directed to impact ("implant") into the silicon. Ion implantation requires expensive equipment and does not permit good concentration depth profile control of the dopant.

Another doping method (in-situ doping) co-deposits the dopant atoms during the process used to deposit the silicon material. Gases such as boron trichloride ($BCl_3$) or phosphine ($PH_3$) are admitted to the chamber simultaneously with silane, resulting in boron- or phosphorus-doped silicon films. This method allows for better control of the depth profile concentration when compared to ion implantation. The concentration depth profile control is achieved by varying the gas flows with time. The cost is also less because silicon film deposition process and the doping process both use the same chamber and are performed simultaneously.

Numerous systems and types of apparatus are used for CVD. Generally, most CVD systems contain a reactor, gas-pumping system, an exhaust system, a temperature control system, and a process control system. For example, a tubular-type low-pressure chemical vapor deposition (LPCVD) system is shown FIG. 1. In this commonly used batch-type CVD system, the system 2 contains a vessel or reactor 10 made of annealed quartz. The reactor 10 is surrounded by a heater 12 used for heating the reactor 10. A boat 20 that carries a number of wafers 18 is then transported into the reactor 10 and placed at a pre-determined position. The exhaust gas of the LPCVD process is released by an exhaust system through a releasing end 16. The boat 20 further contains a wafer stage for holding a certain number of wafers 18, including both product wafers and dummy wafers spaced throughout boat 20. When a LPCVD process is performed, the gaseous reactant 22 is pumped into the reactor 10 from a valve 14.

When using this system 2, the tube, boat, and dummy wafers are all deposited with silicon along with the desired product wafers. The dummy wafers are non-product wafers that are used to maintain consistent deposition (film thickness uniformity) on the product wafers. For example, when a boat holds 150 wafers, it may desirable to deposit silicon on 50 wafers in one deposition and on 100 wafers in another deposition. However, the gas flow dynamics and surface area of 50 wafers loaded in the boat is different than for 100 wafers. Dummy wafers are used such that each deposition is done on 150 wafers, maintaining film thickness uniformity on the product wafers and consistency in the deposition process from one batch to another.

Dummy wafers are often used repeatedly for many depositions. Dummy wafers, however, break when the silicon thickness becomes excessive and must therefore be replaced on a regular basis. Breakage of dummy wafers is often fatal for the product wafers that accompany the dummy wafers in the boat. Particles coming from the broken wafers are spread throughout the system, contaminating product wafers. As well, the robot arm (not shown in FIG. 1) that unloads the dummy wafers may "ram" the broken wafers, causing a moment arm to develop on the quartz boat holding the wafers, often resulting in the boat breaking and the entire load of wafers (both product and other dummy wafers) dropping and breaking.

For the reasons detailed above, as well as other reasons, dummy wafers are typically replaced before they break. Tests are done to determine the thickness of the silicon that can be deposited on the dummy wafer before they break, and then a replacement schedule is developed to replace the dummy wafers well before they break. However, replacing the dummy wafers means "down time" for the CVD system while the dummy wafers are being replaced, e.g., no product wafers can be produced. As well, there is a significant cost in replacing the dummy wafers.

SUMMARY OF THE INVENTION

The present invention provides dummy wafers that are used in IC manufacturing and methods for manufacturing the same. The dummy wafers are made with an increased resistance to breaking during CVD manufacturing process. The dummy wafers are made by placing a protective film over the wafer surface(s) exposed during the CVD process. By increasing the resistance to breaking, the protective film extends the useful life of the dummy wafers.

BRIEF DESCRIPTION OF THE DRAWINGS

FIGS. 1–4 are views of one aspect of the dummy wafers and methods of making the same according to the invention, in which:

FIG. 1 illustrates one type of commonly-used CVD system;

FIG. 2 illustrates one aspect of the dummy wafer of the invention;

FIG. 3 illustrates another aspect of the dummy wafer of the invention; and

FIG. 4 illustrates yet one aspect of the dummy wafer of the invention.

FIGS. 1–4 presented in conjunction with this description are views of only particular—rather than complete—portions of the dummy wafers and methods of making the same according to the invention.

DETAILED DESCRIPTION OF THE INVENTION

The following description provides specific details in order to provide a thorough understanding of the present invention. The skilled artisan, however, would understand that the present invention can be practiced without employing these specific details. Indeed, the present invention can be practiced by modifying the illustrated devices and methods, and can be used in conjunction with apparatus and techniques conventionally used in the industry. The invention is described with reference to dummy wafers used in a doped LPCVD silicon process, but could be modified for dummy wafers used in other doped CVD silicon processes.

Figure 1:
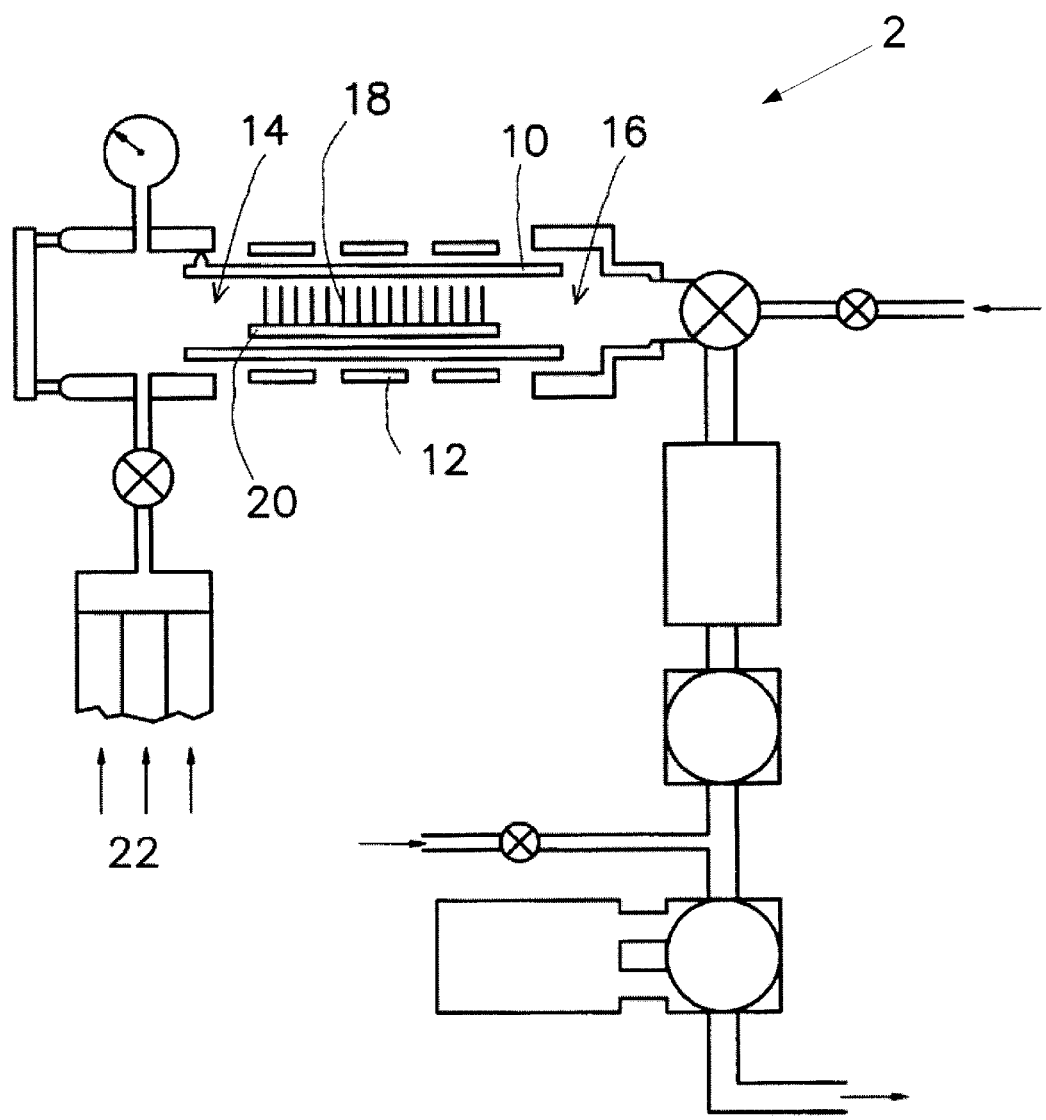
Figure 2:
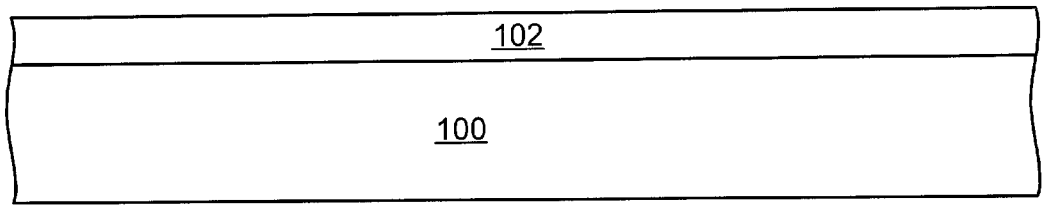

As illustrated in FIG. 2, one aspect of the process of the invention begins with dummy wafer 100. The dummy wafer can be any suitable wafer (or substrate) known in the art which functions as a dummy wafer (or substrate) during a CVD process. Examples of dummy wafers include single-crystal (monocrystalline) silicon wafers, amorphous Si (quartz) wafers, non-Si (GaAs or Ge-based) wafers, SiC wafers, and the like. Because of costs, availability considerations, and chemical compatability, single-crystal Si wafers are preferably used as dummy wafers 100.

In the invention, the size (i.e., radius) and thickness of dummy wafers 100 can be any of those sizes known in the art. The size and thickness should be selected so that the dummy wafer 100 fits within the boat and is compatible with the other apparatus used in the CVD process. The shape of the wafer is likewise not limited, provided the dummy wafer is able to otherwise meet the functions of the dummy wafer described above.

Then, a protective layer (or film) 102 is deposited on the surface(s) of dummy wafers that are desired to be protected. Any surface of the dummy wafer can have the protective film deposited thereon. In one aspect of the invention, the surface(s) for the protective film are those surfaces where the material is expected to be deposited via CVD. Typically, the surface(s) in the path of the gas flow in the CVD system are those surfaces with the protective film 102 deposited thereon.

Figure 3:
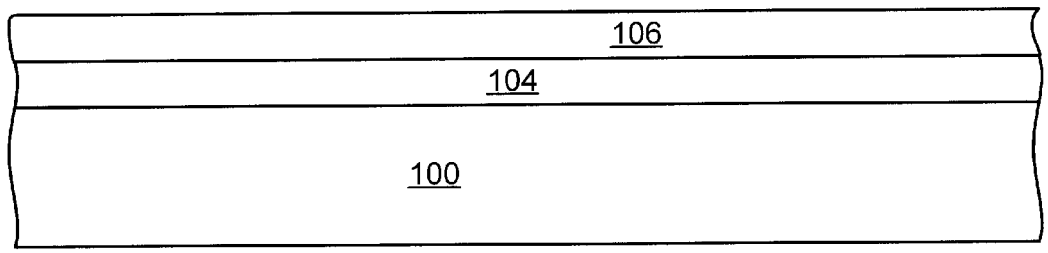
Figure 4:
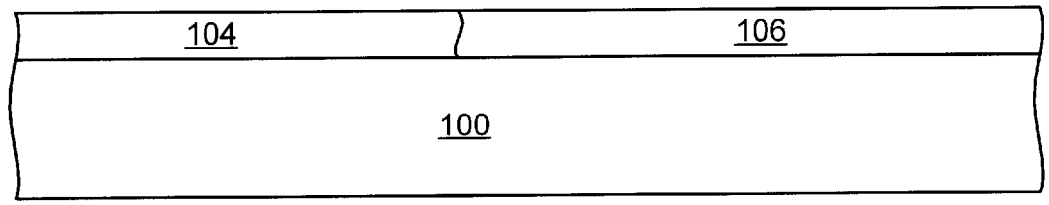

The material used for the protective film 102 can be any material that does not contaminate the product wafers during processing. Examples of suitable materials for Si-containing wafers include silicon-containing materials like SiN, $SiO_2$, SiON, and SiC. As well, combinations of these materials can be used as illustrated in FIGS. 3 and 4, e.g., with a first $SiO_2$ layer 104 and a second SiN layer 106. Of course, other types of materials (non-Si containing materials) could be used for non-Si containing wafers In the aspect of the invention where the dummy wafers comprises Si, a silicon-containing material is used as the material for the protective film 102. Any known processes for making such films can be used in the invention. In one aspect of the invention, the desired surface of the dummy wafer can be pretreated or cleaned before forming the silicon-containing film or layer. The pretreatment may include any number of cleaning steps, such as a wet cleaning of the surface performed by immersing a wafer in an appropriate liquid solution, by spraying the wafer surface with the liquid solution, or by exposing the surface to a cleaning vapor, all optionally accompanied with agitation or scrubbing such as by a brush or sonic power. Other cleaning processes may be utilized in addition to or in place of those described above. For example, other cleaning processes include the use of $NH_4F$ solutions, $NH_4HF$ solutions, or buffered oxide etch (BOE) solutions.

In this aspect of the invention where the dummy wafer comprises Si, the pretreatment may optionally remove any native oxide from the wafer surface. Any known method of removing the native oxide can be used, such an immersion in an HF solution or treatment by an HF vapor is used. The immersion or treatment may be for a period of time limited to, for example, 15 seconds. Such treatment or immersion may be repeated as necessary.

Any known method(s) is then used for forming the silicon-containing layer on the wafer surface. To demonstrate such known processes, exemplary methods for forming SiN protective films are described. Similar methods for non-SiN layers could be used in the invention. Growing a silicon nitride film on a silicon-containing dummy wafer can progress by reacting nitrogen or a nitrogen-containing compound, such as ammonia ($NH_3$), with the wafer surface (which contains silicon atoms). This reaction is typically carried out at elevated temperatures, such as about 900° C. to 1300° C. The reaction is carried out for a time sufficient to "grow" the SiN film to the desired thickness or depth. A typical deposition rate is about 3 Å/min. This process can be used in those aspects of the invention where the dummy wafer contains Si.

Similarly, the silicon nitride layer can also be formed by depositing a silicon layer and then nitriding the silicon layer. The silicon layer can be deposited using any known techniques in the art. Then, the nitriding process is carried out substantially similar to that process described immediately above, e.g., reacting the silicon surface with a nitrogen-containing ambient for a time and temperature sufficient to convert part or all of the silicon layer to SiN.

The silicon nitride layer or film can also be deposited on the dummy wafer surfaces utilizing known CVD techniques, such as plasma enhanced CVD, rapid thermal CVD, and/or atmospheric pressure CVD. For example, a film of silicon nitride can be deposited by reacting silane with ammonia at about 700° C. to 900° C. and at atmospheric pressures. The deposition rate increases rapidly with temperature, e.g., the rate of deposition at 700° C. may be less than 1 nm/min, but may increase to 100–200 mn/min at 900° C. The deposition process can be carried out for a time sufficient to deposit the desired thickness. Other silicon-containing gases and nitrogen-containing gases could also be used, with appropriate changes in the time and temperature needed to deposit the desired thickness.

Likewise, a low-pressure chemical vapor deposition (LPCVD) process may be used for depositing the silicon nitride film. The LPCVD silicon nitride process may include, for example, reacting 50 sccm dichlorosilane ($SiH_2Cl_2$) and 150 sccm ammonia ($NH_3$) at a temperature of about 720° C. at a pressure of about 140 mtorr for a time sufficient to obtain a thickness of 1650 Å.

The ratio of the silicon to nitrogen in the SiN layer is not merely one to one, as normally represented by its chemical formula. In one aspect of the invention, the Si to N ratios in such films can range from about 0.7 to about 1.1, and is preferably about 0.75. As well, the SiN films deposited can contain bonded hydrogen in the form of Si—H and N—H bonds.

In such processes, the thickness of the protective film 102 can vary depending on the constraints of the CVD apparatus (i.e., temperature or pressure limits), as well as the type of material used as the protective film. In one aspect of the invention, the thickness of the protective film is greater than about 1500 angstroms. Preferably, the thickness of the protective film ranges anywhere from about 1000 angstroms to about 6500 angstroms. When SiN is used as the material for the protective film, the thickness is preferably about 1000 to about 1650 angstroms.

The protective film 102 operates to protect the dummy wafers and extend their useful life during CVD processes used in IC fabrication methods. In particular, SiN films are especially useful for single crystal Si dummy wafers used in LPCVD processes depositing polysilicon with in-situ doping. The SiN films extend the useful life of the Si dummy wafers by reducing their tendency to break during the polysilicon deposition process.

EXAMPLE

A group of monocrystalline Si wafers with a thickness of about 550 $\mu$m and a diameter of about 200 mm was selected. Sets of 25 wafers were then separated from the group. A first set of wafers was left bare, e.g., without any protective film. A second set of wafers had a 1000 angstrom thermal $SiO_2$ film grown on the surface of each wafer. A third set of wafers had a 5500 angstrom $SiO_2$ film grown on the surface of each wafer. A fourth set of wafers had a 1000 angstrom SiN film deposited on the surface of each wafer. A fifth set of wafers had a 5500 angstrom $SiO_2$ film and then a 1000 angstrom SiN film deposited on the surface of each wafer. A sixth set of wafers was made of SiC. A seventh set of wafers had a 1650 angstrom SiN film deposited on the surface of each wafer.

Each set of dummy wafers was then used in an in situ doping polysilicon LPCVD process. Depositions were performed at temperatures ranging from about 450–580° C. and at pressures ranging from about 200–600 mTorr. Films were doped p-type or n-type by flowing $BCl_3$ or $PH_3$, respectively, simultaneous with $SiH_4$. A helium "carrier" gas was also flowed to better mix and distribute the gas in the tube. The resultant dopant concentrations ranged from $1\times10^{16}/cm^3$ to $1\times10^{21}/cm^3$. The film thicknesses for individual depositions ranged from about 200–4000 Å. The dummy wafers were then used in multiple CVD deposition processes until they broke. The thickness of the sequentially deposited films were measured and recorded for each set of dummy wafers. The average thickness of the polysilicon layer on the dummy wafer when it begins to break is reported in Table 1.

TABLE 1

| Protective Film | PolySilicon Thickness at Breakage |
|---|---|
| No Film | <1 $\mu$m |
| 1000 ang. $SiO_2$ | 14 $\mu$m |
| 550 ang. $SiO_2$ | 23 $\mu$m |
| 1000 ang. SiN | 27 $\mu$m |
| 5500 ang. $SiO_2$ + 1000 ang. SiN | 30 $\mu$m |
| SiC | 113 $\mu$m |
| 1650 ang. SiN | 27 $\mu$m |

While the composite $SiO_2$+SiN film had the longest life, it was not significantly better than the SiN film to justify the cost of two film depositions. As well, while the SiC wafers provide the longest life, they are very expensive to purchase. Thus, the SiN protective film provided the best results for the cost.

Having described the preferred embodiments of the present invention, it is understood that the invention defined by the appended claims is not to be limited by particular details set forth in the above description, as many apparent variations thereof are possible without departing from the spirit or scope thereof.

We claim:

1. A dummy wafer for semiconductor processing, comprising:

a wafer;

a protective layer over a surface of the wafer, the protective layer increasing the wafer's resistance to breaking during semiconductor processing; and a layer of silicon over the protective layer.

2. The dummy wafer of claim 1, wherein the wafer is a Si wafer.

3. The dummy wafer of claim 2, wherein the protective layer comprises $SiO_2$, SiN, or a combination thereof.

4. The dummy wafer of claim 3, wherein the protective layer comprises SiN.

5. The dummy wafer of claim 4, wherein the SiN layer has a thickness ranging from 1000 angstroms to about 1650 angstroms.

6. A dummy wafer for semiconductor processing, comprising:

a Si-containing wafer;

a silicon-containing protective layer over a surface of the wafer, the protective layer increasing the wafer's resistance to breaking during semiconductor processing; and a doped polysilicon layer over the silicon-containing protective layer.

7. The dummy wafer of claim 6, the protective layer comprising SiN.

8. A dummy wafer for semiconductor processing, comprising:

a Si wafer;

a SiN protective layer over a surface of the wafer with a thickness of about 1000 angstroms to about 1650 angstroms, the protective layer increasing the wafer's resistance to breaking during semiconductor processing; and a polysilicon layer over the SiN protective layer.

9. A system for CVD containing a dummy wafer comprising:

a wafer;

a protective layer over a surface of the wafer, the protective layer increasing the wafer's resistance to breaking during semiconductor processing; and a polysilicon layer on the protective layer.

10. A system for CVD containing a dummy wafer comprising:

a Si-containing wafer;

a silicon-containing protective layer over a surface of the wafer, the protective layer increasing the wafer's resistance to breaking during semiconductor processing; and a doped polysilicon layer deposited by a CVD process on the silicon-containing protective layer.

11. A system for polysilicon CVD containing a dummy wafer comprising:

a Si wafer;

a SiN protective layer over a surface of the wafer with a thickness of about 1000 angstroms to about 1650 angstroms, the protective layer increasing the wafer's resistance to breaking during semiconductor processing; and a CVD-deposited polysilicon layer over the SiN protective layer.

* * * * *